United States Patent [19]
Retzlaff

[11] Patent Number: 5,754,052
[45] Date of Patent: May 19, 1998

[54] DEVICE FOR MEASURING STORAGE BATTERY CELL PARAMETERS

[75] Inventor: Werner Retzlaff, Friedberg, Germany

[73] Assignee: Mentzer Electronic GmbH, Wolfersheim-Berstadt, Germany

[21] Appl. No.: 651,912

[22] Filed: May 21, 1996

[30] Foreign Application Priority Data

May 22, 1995 [DE] Germany .................. 195 18 729.6

[51] Int. Cl.⁶ .................................................. G01N 27/416
[52] U.S. Cl. .................................................. 324/434; 320/48
[58] Field of Search .................................. 324/433, 713, 324/434, 435; 340/636; 320/48, 39, 18; 364/483

[56] References Cited

FOREIGN PATENT DOCUMENTS

| | | |
|---|---|---|
| 0 112 242 A1 | 6/1984 | European Pat. Off. . |
| 0 277 321 | 8/1988 | European Pat. Off. . |
| 31 46 141.7 | 6/1983 | Germany . |
| 94/07153 | 3/1994 | WIPO . |

*Primary Examiner*—Christine K. Oda
*Attorney, Agent, or Firm*—Anthony J. Casella; Gerald E. Hespos; Ludomir A. Budzyn

[57] ABSTRACT

A device for measuring the cell parameters of an entire storage battery having several series-connecter cells. A non-linear circuit is connected between each electric connecting point of the cells and a common measurement point. The non-linear circuits have known current-voltage characteristics which can be varied by an element connected between the common measurement point and an end pole or a selected connecting point of the entire battery. The parameters of the individual cells can be determined from the electric variables established at the common measurement point, for different values of the element, and the corresponding operating points of the individual non-linear circuits, as defined by the known current-voltage characteristics.

20 Claims, 1 Drawing Sheet

5,754,052

DEVICE FOR MEASURING STORAGE BATTERY CELL PARAMETERS

BACKGROUND OF THE INVENTION

The present invention relates to a device for measuring cell parameters of a storage battery having a plurality of cells connected in series.

Upon the use of multi-cell storage batteries, the terminal voltages of the individual cells or groups of cells unavoidably have different terminal voltages. (In the following, the term "cell" will be used both for individual cells and for groups of cells. The expression thus includes, in each case, all individual cells combined into a single unit for measurement.)

In order to avoid overcharging or low-charging of individual cells, it is desirable to measure the largest possible number of partial voltages. This applies also to the individual cell temperatures. Furthermore, in the event of the failure of a battery it is difficult and time-consuming to discover the cell or cells which are defective. Clarification of the cause of the failure is also not readily possible.

For the measurement of partial voltages, measuring devices are known each of which has a measurement line between each cell which is to be measured and a central measurement station. The expense for wiring and contacting at the measurement station inherent therein is considerable.

Furthermore a circuit for continuously checking the quality of a multi-cell storage battery is known from EP 0 277 321. In accordance with that prior art, each cell has, associated with it, a measurement circuit which is triggered over the common control line and/or measurement line, the measured values being fed, one after the other, over the common measurement line to a common evaluation circuit. The disadvantage of that arrangement is that each measurement circuit must be connected to both poles of the cell to be measured, the measurement circuit requires energy which is taken from the battery to be measured, and each measurement circuit has a device for the signal coding and coupling members for the separation of the potential.

The problem forming the basis of the present invention consists accordingly of providing a device of the simplest possible construction for the measuring of storage battery cell parameters.

SUMMARY OF THE INVENTION

This problem is solved by a device and a method for measuring cell parameters of an entire battery having several cells connected in series, which has the features set forth in claims 1 and 12.

In the device of the invention, each connecting point between the cells is contacted only once. Furthermore, the non-linear circuits which can be arranged close to the battery come together at a common measurement point, so that only a single line extending from the common measurement point is necessary for the tapping-off of the electrical measurement values.

The non-linear circuit is preferably a passive circuit, so that no substantial loading of the battery by active loads results from the measurement device.

One particularly simple non-linear circuit for performing the function in accordance with the invention is a source of current the intensity of which has a predetermined non-linear dependence on its terminal voltage. The non-linear current-voltage characteristic of the source of current is preferably such that the source of current supplies current only within a predetermined terminal-voltage range. Such sources of current are particularly easy to produce structurally. A preferred embodiment is one in which the source of current is formed by a series connection of diode and resistor.

As control value there is preferably employed the resistance of a controllable resistor, since a controllable resistor is particularly easy and economical to produce.

As the electric values which are developed at the common measurement point there are detected preferably the potential thereof as well as the current flowing through the controllable resistor. The current flowing through the controllable resistor corresponds in this connection to the sum of the individual currents of all non-linear circuits (sources of current).

The control unit and the measurement unit are preferably combined to form a combined measurement and control unit which is controlled by a computer in accordance with one particularly preferred embodiment.

By means of the preferred embodiments described up to now, the corresponding partial voltages of the individual cells can be determined as cell parameters in order in this way easily to detect overcharges, low charges, or failures.

As an alternative or in addition, in accordance with the invention, the cell temperature can be measured as cell parameter to be detected. This is preferably obtained in a particularly simple manner if the non-linear circuit has a known temperature dependence and is thermally coupled with the corresponding cell to be measured. For the cumulative measurement of cell voltage and cell temperature there is preferably employed a source of current having a non-linear current-voltage characteristic and temperature dependence.

DETAILED DESCRIPTION OF THE PREFERRED EMBODIMENTS

Figure 1:
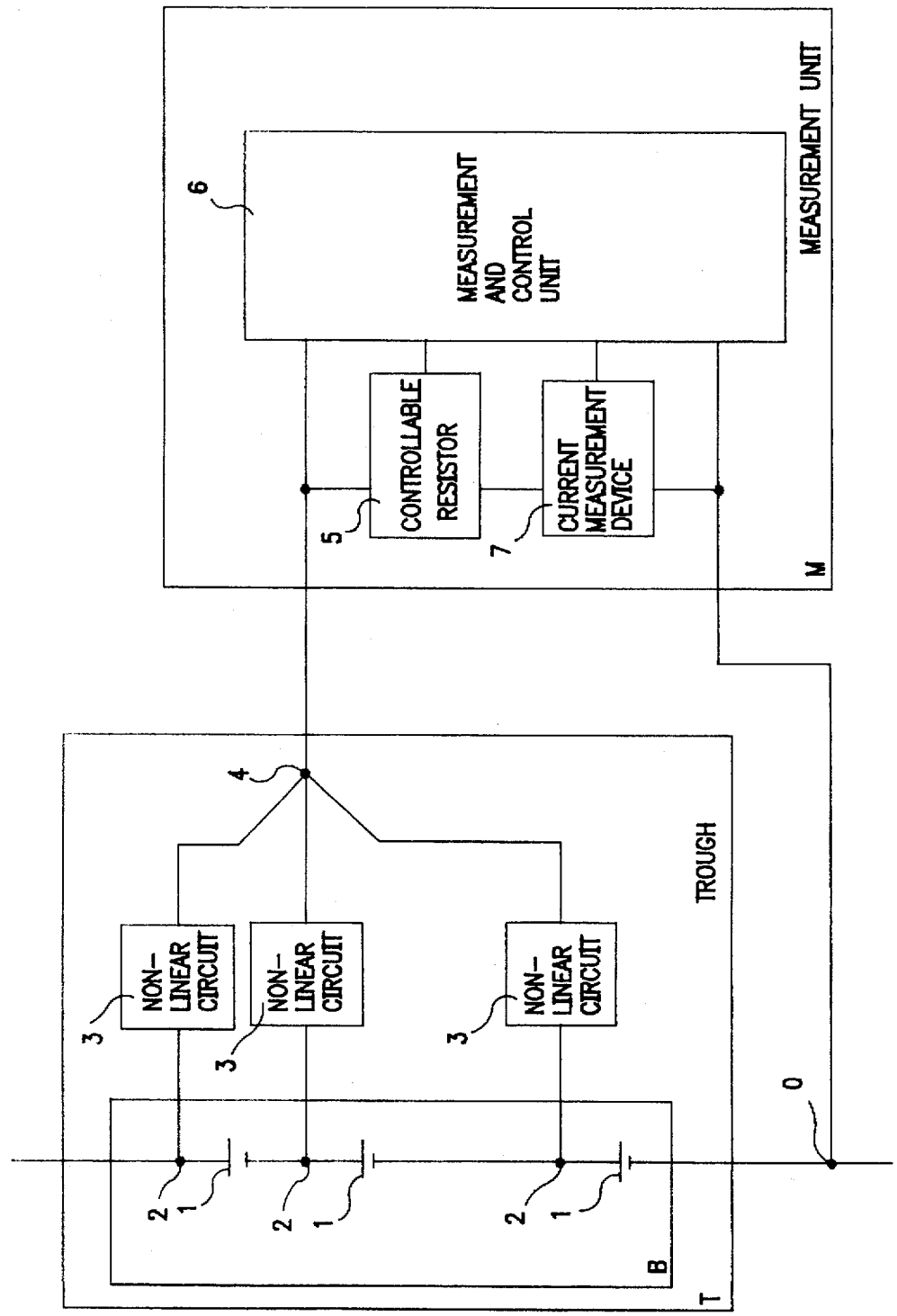
FIG. 1 is a schematic of the new and improved measurement device.

The invention will be described below on basis of an embodiment with reference to the accompanying sole figure of the drawing, which is a diagrammatic showing of one embodiment of the measurement device of the invention.

A storage battery B consists of several individual cells 1, connected in series. Between each electric connecting point 2 of the series-connected cells 1 and a common measurement point 4 there is connected in each case a source of current 3 the current-voltage characteristic of which is of a pronounced non-linear nature. The battery B, the sources of current 3, and the measurement point 4 form a battery unit or a trough T.

A measurement device M which can be arranged remote from the battery unit T is connected via the connecting line to the common point 4. Furthermore, the measurement device M is connected to an end pole O of the battery B. As an alternative, the measurement device could be connected to any one of the connecting points 2.

The measurement unit M has a computer-controlled measurement and control unit 6, a controllable resistor 5 and a current measuring device 7 connected in series with said resistor. The series connection of the controllable resistor 5 and current measuring device 7 is connected at one end to the connecting line coming from the measurement point 4 and at the other end to the line coming from the end pole O of the battery B.

Furthermore, the measuring and control unit 6 is connected directly to the connecting line coming from the measurement point 4 as well as to the line coming from the end pole O, so that the voltage between the common point 4 and the end pole O of the entire battery B can be measured by the computer-controlled measurement and control unit 6 (common-point voltage).

The measurement and control unit 6 is furthermore connected to the current measurement device 7, so that the current flowing through the controllable resistor 5 can be measured by the measurement and control unit 6.

The measurement and control unit 6 controls the controllable resistor 5 and thus changes its resistance.

With this arrangement, the individual cell voltages can be found in the manner that the controllable resistor 5 is adjusted, one after the other, to a number of resistance values which is at least as great as the number of partial voltages to be measured. At each measurement point which is fixed by a resistance value, pairs of values of measurement point voltage and current through the controllable resistor 5 are measured and stored in the computer-controlled measurement and control unit 6. From these pairs of values, with a knowledge of the non-linear current-voltage characteristic of the sources of current, the individual partial voltages of the cells 1 can be calculated, for instance by iterative solution of a system of non-linear equations in the computer-controlled measurement and control unit 6.

In order to obtain a high accuracy, the measurement points should be so selected that the measurement point voltages are distributed approximately uniformly over the range of the entire battery voltage. Furthermore, the distribution of the connection potentials should not change substantially during a measurement cycle. Therefore the measurement cycle should be as short as possible and possibly be repeated several times.

The method of measurement is particularly simple if the non-linear current-voltage characteristic of the sources of current is so selected that the sources of current supply current only in a given terminal-voltage range. The current-voltage characteristic of a source of current $i=f(v)$ is thus:

$$i = 0 \quad \text{for } v < v0$$
$$i = g(v) * v \quad \text{for } v \geq v0$$

The function $g(v)$ must be known, and should be technically easy to realize. Furthermore, it is advantageous if the connection voltages $v0$ and the $g(v)$'s of all current sources are the same. Particularly simple embodiments for $g(v)$ are:

$$g(v) = G = \text{constant} \quad \text{(ohmic resistance)}$$
or
$$g(v) = G/v \quad \text{(constant source of current)}.$$

A particularly inexpensive embodiment for the first variant with ohmic resistance is obtained, for instance, if diodes are used for the connecting of the sources of current and if therefore each source of current consists of the series connection of a diode and a resistor. The non-ideal switch behavior of the diodes can be numerically corrected in the computer-controlled measurement and control unit 6 at slight expense.

The voltage v of a source of current k is equal to the difference between the connection or junction potential vk and the common-point potential vs, namely $v=vk-vs$.

For the measurement of the voltage of a k-th cell, there are required in this simple embodiment only four pairs of values, namely two pairs of current-voltage values in which all sources of current 1 to k are connected and two corresponding pairs of values in connection with which all current sources 1 to k+1 are connected. From the current and voltage differences, the cell voltage and the conductance of the k-th and (k+1)-th source of current can be calculated.

If this measurement is applied in succession to all cells, the computer expense is substantially less than upon the solution of the system of non-linear equations, since only four pairs of measurement values in each case need be handled. Furthermore, the time for the measurement of a selected cell voltage is less. The time for the measurement of all cell voltages is, however, greater.

If one selects for $g(v)$ a unit (for instance a thermistor) having a pronounced temperature dependence $i=g(v, t)$ and if each of these now temperature-dependent sources of current is coupled thermally with the corresponding cell to be measured, then, with the same simple arrangement, one can measure not only all cell voltages but also all cell temperatures t.

I claim:

1. A device for measuring partial voltages and/or temperatures of an entire battery (B) having a plurality of series-connected cells (1), a non-linear circuit (3) being connected between each electric connecting point (2) of the cells (1) and a common measurement point (4), each said non-linear circuit (3) being thermally connected to at least one of said cells (1), each said non-linear circuit (3) having predetermined operating current-voltage characteristics with said predetermined operating current-voltage characteristics having predetermined temperature dependency, characterized by the fact that between the measurement point (4) and an end pole (O) or a selected connecting point of the entire battery (B) an element (5) is connected for selectively adjusting a control variable to alter the operating points of the individual non-linear circuits (3), and that the element (5) is connected to an evaluation circuit (6) which determines the partial voltages and/or the temperatures of the individual cells (1) from the voltage at the measurement point (4) and the current through the element (5).

2. A measuring device according to claim 1, in which the non-linear circuit (3) is a passive circuit.

3. A measuring device according to claim 1, wherein a terminal voltage is applied across the non-linear circuit (3), and wherein the non-linear circuit (3) is a source of current the intensity of which has a predetermined non-linear dependence on its terminal voltage.

4. A measuring device according to claim 3 in which the current-voltage characteristic of the source of current (3) is selected such that the source of current supplies current only within a predetermined terminal-voltage range.

5. A measuring device according to claim 4, in which the source of current (3) consists of a series connection of diode and resistor.

6. A measuring device according to claim 5, in which the element (5) is a controllable resistor (5), and the control variable is the resistance of said controllable resistor (5) which is selectively varied by a control unit (6).

7. A measuring device according to claim 6, in which a measurement unit (6) detects the voltage between the common measurement point (4) and the end pole (O) or the selected connecting point as well as the current flowing through the controllable resistor (5) as the electric variables which are established at the common measurement point (4).

8. A measuring device according to claim 7, in which the control unit and the measurement unit are combined in a combined measurement and control unit (6).

9. A measuring device according to claim 8, in which the resistance of the source of current is a temperature-dependent resistance which is thermally coupled with the respective cell to be measured.

10. A method of measuring cell parameters of an entire battery (B) having a plurality of series-connected cells (1), said method having the following steps:
   a) Providing a non-linear circuit for each terminal located between two of the cells, each said non-linear circuit being electrically connected to said respective terminal and a single common measurement point, each said non-linear circuit having known current-voltage characteristics;
   b) Providing an electrical connection between said single common measurement point and an end pole of said battery or a selected connecting point on the entire battery, an element being electrically connected to said electrical connection, said element being adapted for selectively adjusting a control variable;
   c) Adjustment of the element (5) to a given control variable so that operating points of the individual non-linear circuits are established,
   d) Measurement of electric variables related to the common measurement point (4),
   e) N-times repetition of steps c) and d) with the number of changes of the control variable corresponding to the number of cells,
   f) Determination of the partial voltages and/or temperatures from the N measured sets of electric variables.

11. A method according to claim 12, in which, by control of the element (5), the voltage between the common measurement point (4) and the end pole (O) of the entire battery is adjusted to at least a number of different voltage values corresponding to the number of cells and the potentials of all connection points (2) are calculated in a measurement and control unit (6) from the pairs of current-voltage values measured at each adjustment point and the known current-voltage characteristics of the non-linear circuits (3).

12. A device for measuring partial voltages and/or temperatures of an entire battery (B) having a plurality of series-connected cells (1), a non-linear circuit (3) being connected between each electric connecting point (2) of the cells (1) and a common measurement point (4), each said non-linear circuit (3) having predetermined operating current-voltage characteristics, characterized by the fact that between the measurement point (4) and an end pole (O) or a selected connecting point of the entire battery (B) an element (5) is connected for selectively adjusting a control variable to alter the operating points of the individual non-linear circuits (3), and that the element (5) is connected to an evaluation circuit (6) which determines the partial voltages and/or the temperatures of the individual cells (1) from the voltage at the measurement point (4) and the current through the element (5), wherein a terminal voltage is applied across each said non-linear circuit (3), and wherein each said non-linear circuit (3) is a source of current the intensity of which has a predetermined non-linear dependence on its terminal voltage.

13. A measuring device according to claim 12 in which the current-voltage characteristic of the source of current (3) is selected such that the source of current supplies current only within a predetermined terminal-voltage range.

14. A measuring device according to claim 13, in which the source of current (3) consists of a series connection of diode and resistor.

15. A measuring device according to claim 14, in which the element (5) is a controllable resistor (5), and the control variable is the resistance of said controllable resistor (5) which is selectively varied by a control unit (6).

16. A measuring device according to claim 15, in which a measurement unit (6) detects the voltage between the common measurement point (4) and the end pole (O) or the selected connecting point as well as the current flowing through the controllable resistor (5) as the electric variables which are established at the common measurement point (4).

17. A measuring device according to claim 16, in which the control unit and the measurement unit are combined in a combined measurement and control unit (6).

18. A measuring device according to claim 17, in which the non-linear circuit (3) has a known temperature dependence and is thermally coupled to the corresponding cell to be measured.

19. A measuring device according to claim 18, in which the current-voltage characteristic of the source of current (3) has the known temperature dependence.

20. A measuring device according to claim 19, in which the resistance of the source of current is a temperature-dependent resistance which is thermally coupled with the respective cell to be measured.

* * * * *